(12) United States Patent
Kloeckner

(10) Patent No.: US 6,496,011 B2
(45) Date of Patent: Dec. 17, 2002

(54) MONITORING METHOD AND MONITORING DEVICE FOR A FILTER

(75) Inventor: Manfred Kloeckner, Erlangen (DE)

(73) Assignee: Siemens Aktiengesellschaft, Munich (DE)

( * ) Notice: Subject to any disclaimer, the term of this patent is extended or adjusted under 35 U.S.C. 154(b) by 0 days.

(21) Appl. No.: 09/803,181

(22) Filed: Mar. 9, 2001

(65) Prior Publication Data

US 2001/0009365 A1 Jul. 26, 2001

Related U.S. Application Data

(63) Continuation of application No. PCT/DE99/02705, filed on Aug. 30, 1999.

(30) Foreign Application Priority Data

Sep. 11, 1998 (DE) .......................................... 198 41 715

(51) Int. Cl.⁷ ........................ G01R 31/00; G01R 31/08; G01R 31/28
(52) U.S. Cl. ........................ 324/500; 324/522; 324/537
(58) Field of Search ................................ 324/500, 537, 324/522, 548, 519, 532, 535; 363/47; 361/15, 42; 702/199, 79; 333/181

(56) References Cited

U.S. PATENT DOCUMENTS

| | | | | |
|---|---|---|---|---|
| 3,970,901 A | * | 7/1976 | Rohr | 361/110 |
| 4,050,025 A | * | 9/1977 | Gerber | 327/355 |
| 4,713,604 A | * | 12/1987 | Becker et al. | 324/500 |
| 5,345,358 A | * | 9/1994 | Kumar | 318/376 |

FOREIGN PATENT DOCUMENTS

| | | |
|---|---|---|
| DE | 1093904 | 9/1959 |
| DE | 3020110 | 1/1982 |
| DE | 4107366 | 4/1992 |
| DE | 4444409 | 4/1996 |
| EP | 0267548 | 5/1988 |

* cited by examiner

Primary Examiner—N. Le
Assistant Examiner—Anjan K. Deb
(74) Attorney, Agent, or Firm—Baker Botts LLP

(57) ABSTRACT

Monitoring method and monitoring device for a filter mounted upstream from a electric circuit which has at least one filter component with a filter characteristic. With these method and device, a time characteristic of at least one filter current flowing in the filter and a time characteristic of at least one filter voltage present in the filter are recorded during the operation of the electric circuit. At least one filter characteristic is then determined from the time characteristics.

11 Claims, 1 Drawing Sheet

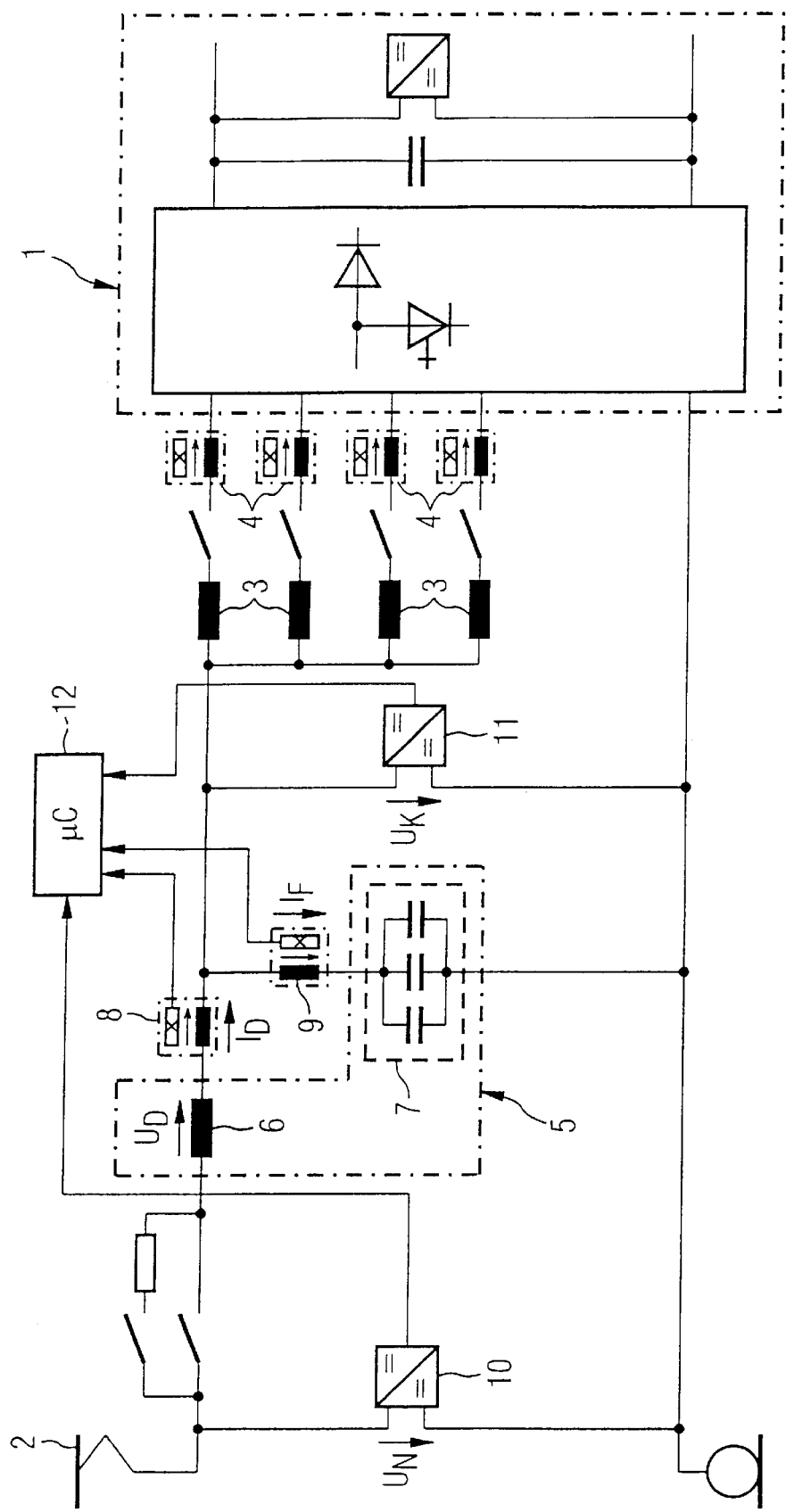

MONITORING METHOD AND MONITORING DEVICE FOR A FILTER

This is a continuation of copending application Ser. No. PCT/DE99/02705 filed Aug. 30, 1999, PCT Publication WO 00/15456.

FIELD OF THE INVENTION

The present invention relates to a monitoring method for a filter mounted upstream of an electric circuit having at least one filter component with a filter characteristic, and to a corresponding monitoring device.

BACKGROUND INFORMATION

European Patent Application No. 0 267 548 describes a rail vehicle which is operated on a DC voltage system and which has an input filter on the system side. The input filter comprises an inductance and a capacitance. A failure of one of these two components, or even both components, has adverse effects on the response to disturbing currents.

Disturbing currents are often subject to safety limit values. Consequently, it is absolutely necessary for this filter to function dependably.

The object of the present invention is to provide a simple, reliable and inexpensive monitoring method and a corresponding monitoring device with which a continuous monitoring of the filter is possible.

SUMMARY OF THE INVENTION

The object of the present invention is achieved for the monitoring method by recording a time characteristic of at least one filter current flowing in the filter, as well as a time characteristic of at least one filter voltage present in the filter during the operation of the circuit and by determining at least one filter characteristic from the time characteristics.

The object for the monitoring device is achieved by it having at least one ammeter for recording a time characteristic of at least one filter current flowing in the filter, at least one voltmeter for recording a time characteristic of at least one filter voltage present in the filter and an evaluation unit connected to the at least one ammeter and the at least one voltmeter for determining the at least one filter characteristic from the time characteristics.

If the time characteristics of the filter current and/or of the filter voltage are averaged before the determination of the at least one filter characteristic, the influences of disturbances on the filter characteristic determined are smaller.

The filter component may be an inductor with an inductance or a capacitor with a capacitance. If the filter component is an inductor with an inductance, the inductance is determined as the quotient of a filter voltage and a change in the corresponding filter current.

In this case, the determination of the inductance can be suppressed if the absolute value of the change in the filter current falls below a limit value or the change in the filter current and/or the absolute value of the filter voltage falls below a limit value for the filter voltage. This is because the inductance is then affected by a great measuring error, so that a reliable indication of the actual inductance cannot be necessarily obtained.

If, on the other hand, the filter component is a capacitor with a capacitance, the capacitance can be determined as the quotient of a filter current and a change in the filter voltage corresponding to this. In this case, the determination of the capacitance can be suppressed if the absolute value of the change in the filter voltage goes below a limit value for the change in the filter voltage and/or the absolute value of the filter current falls below a limit value for the filter current. This is because the capacitance may then be affected by a great measuring error, so that no reliable indication of the actual capacitance can be obtained.

The filter voltage and/or the filter current or their changes may possibly be corrected by ohmic components.

The monitoring method can preferably be used in the case of an input filter of a power supply device of a rail vehicle. Consequently, the circuit may preferably be a power supply device of a rail vehicle.

BRIEF DESCRIPTION OF THE DRAWING

Further advantages and details are provided from the following description of an exemplary embodiment, in which:

FIGURE shows a filter with a monitoring device according to the present invention.

DETAILED DESCRIPTION

As shown in FIGURE (in which only selected input components of the circuit 1 are represented for the sake of clarity), an electric circuit 1 is supplied with electrical energy via a DC voltage system 2. The circuit 1 may be, for example, a power supply device 1 of a rail vehicle or a traction converter of a rail vehicle.

Mounted upstream from the circuit 1 are inductors 3 along with assigned ammeters 4. System disturbances can be recorded and possibly corrected using the ammeter(s) 4.

The system disturbances can be recorded with the ammeter(s) 4 preferably if an upstream filter 5 (e.g., an input filter) is functioning properly. As shown in FIG. 1, the filter 5 includes two filter components, i.e., an inductor 6 and a capacitor 7. The inductor 6 has, as the filter characteristic, an inductance L. The capacitor 7 has, as the filter characteristic, a capacitance C.

A monitoring device for the filter 5 has two ammeters 8, 9 and two voltmeters 10, 11. With the ammeters 8, 9 and the voltmeters 10, 11, the time characteristics of a system voltage $U_N$, a capacitor voltage $U_F$, an inductor current $I_D$ and a capacitor current $I_F$ can be recorded during the operation of the circuit 1. An evaluation unit 12 is connected to the ammeters 8, 9 and voltmeters 10, 11. The evaluation unit 12 may be, for example, a microcomputer 12. The measurement results of the ammeters 8, 9 and the voltmeters 10, 11 can be continuously transmitted to the evaluation unit 12. The evaluation unit 12 determines from the measurement results the inductance L and the capacitance C. The exemplary measurement according to the present invention takes place as described below.

On the basis of the frequent load changes of the circuit 1 and possibly other units (not shown in FIGURE) that are connected to the DC voltage system 2, the currents $I_D$, $I_F$ and voltages $U_N$, $U_K$ recorded by the ammeters 8, 9 and the voltmeters 10, 11 change constantly.

In an analogous manner, the capacitance C can be determined as the quotient of the capacitor current $I_F$ and the corresponding change in the capacitor voltage. The change in the capacitor voltage is obtained as the difference between two capacitor voltages $U_K$, divided by the time interval between the two measurements.

The inductance L can consequently be determined as the quotient of an inductor voltage $U_D$ and a change in the inductor current. The inductor voltage $U_D$ is obtained from the difference between the system voltage $U_N$ and the capacitor voltage $U_K$. The system voltage $U_N$ and the capacitor voltage $U_K$ may possibly be corrected by an ohmic voltage drop. However, the inductor voltage $U_D$ could also be measured directly. The change in the inductor current is obtained as the difference between two measurements of the inductor current $I_D$, divided by the time interval between the two measurements. The inductor current $I_D$ can also be determined indirectly from the measured values of the ammeters 4, 8.

In an analogous manner, the capacitance C can be determined as the quotient of the capacitor current $I_F$ and the corresponding change in the capacitor voltage. The change in the capacitor voltage is obtained as the difference between two capacitor voltages $U_K$, divided by the time interval between the two measurements.

To increase the measuring accuracy, the integral forms may of course also be used instead of the above differential forms. The filter characteristics L, C determined for the inductor 6 and the capacitor 7 may constantly supply information on the effectiveness of the filter 5.

If an absolute value of the change in the inductor current falls below a limit value for the change in the inductor current, the calculation of the inductance L is suppressed. This is because, in this case, the calculated filter characteristic L may be affected by too great of an uncertainty factor to supply a reliable indication of the actually effective inductance. Alternatively or additionally, the calculation of the inductance L may also be suppressed if the absolute value of the inductor voltage $U_D$ goes below a limit value for the inductor voltage.

In an analogous manner, the calculation of the capacitance C may be suppressed if the absolute value of the change in the capacitor voltage falls below a limit value for the change in the capacitor voltage and/or the absolute value of the capacitor current falls below a limit value for the capacitor current.

Depending on the configuration of the monitoring device, a measuring signal can be read in from each of the ammeters 8, 9 and the voltmeters 10, 11 in a quick succession. For example, a new measured value can be recorded every millisecond. To minimize disturbing influences, if the measured values are recorded rapidly, a plurality of measured values or the time characteristics of the recorded currents $I_D$, $I_F$ and voltages $U_N$, $U_K$ can be averaged. This may take place, for example, by low-pass filtering or averaging a predetermined number of successive measured values (e.g. 3, 5, 10, etc.)

According to an exemplary embodiment of the present invention, the voltage system 2 can be designed as a DC voltage system. However, the monitoring method and the monitoring device of the present invention can also be used when feeding through an AC voltage system.

It should be additionally mentioned that the measuring signals of the ammeters 4 are also transmitted to the evaluation unit 12. Consequently, one of the ammeters 4, 8 and 9 may be redundant, and can possibly be omitted, and its current value calculated from the measured values of the other ammeters 4, 8 and 9.

What is claimed is:

1. A monitoring method for a filter mounted upstream from an electric circuit, the electric circuit including at least one filter component which has at least one filter characteristic, the method comprising the steps of:
   (a) during the operation of the electric circuit, recording a first time characteristic of at least one filter current which flows in the filter and a second time characteristic of at least one filter voltage present in the filter; and
   (b) determining the at least one filter characteristic as a function of the first and second time characteristics.

2. The monitoring method according to claim 1, further comprising the step of:
   (c) before step (b), averaging at least one of the first time characteristic and the second time characteristic.

3. The monitoring method according to claim 1, wherein the at least one filter component includes an inductor, and the at least one filter characteristic includes an inductance, and further comprising the step of:
   (d) determining the inductance as a quotient of the at least one filter voltage and as a change in the at least one filter current corresponding to the at least one filter voltage.

4. The monitoring method according to claim 3, further comprising the step of:
   (e) suppressing the determination of the inductance if at least one of:
   an absolute value of the change in the at least one filter current falls below a first limit value for the change in the at least one filter current, and
   an absolute value of the at least on filter voltage falls below a second limit value for the at least one filter voltage.

5. The monitoring method according to claim 1, wherein the at least one filter component includes a capacitor, and the at least one filter characteristic includes a capacitance, and further comprising the step of:
   (f) determining the capacitance as a quotient of the at least one filter current and a change in the at least one filter voltage corresponding to the at least one filter current.

6. The monitoring method according to claim 5, further comprising the step of:
   (g) suppressing the determination of the capacitance if at least one of:
   an absolute value of the change in the at least one filter voltage falls below a first limit value for the change in the at least one filter voltage, and
   an absolute value of the at least one filter current falls below a second limit value for the at least one filter current.

7. The monitoring method according to claim 1, wherein the filter includes an input filter of a power supply device of a rail vehicle.

8. A monitoring device for a filter mounted upstream from an electric circuit which has at least one filter component with a filter characteristic, comprising:
   at least one ammeter capable of recording a first time characteristic of at least one filter current which flows in the filter;
   at least one voltmeter capable of recording a second time characteristic of at least one filter voltage which is present in the filter; and
   an evaluation unit connected to the at least one ammeter and the at least one voltmeter, the evaluation unit capable of determining the at least one filter characteristic from the first and second time characteristics.

9. The monitoring device according to claim 8, wherein the at least one filter component includes an inductor.

10. The monitoring device according to claim 8, wherein the at least one filter component includes a capacitor.

11. The monitoring device according to claim 8, wherein the electric circuit is a power supply device of a rail vehicle.

* * * * *